United States Patent
Huangfu

(10) Patent No.: US 10,368,033 B2
(45) Date of Patent: Jul. 30, 2019

(54) DISPLAY DEVICE AND VIDEO COMMUNICATION TERMINAL

(71) Applicant: BOE TECHNOLOGY GROUP CO., LTD., Beijing (CN)

(72) Inventor: Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/310,154

(22) PCT Filed: Nov. 4, 2015

(86) PCT No.: PCT/CN2015/093747
§ 371 (c)(1),
(2) Date: Nov. 10, 2016

(87) PCT Pub. No.: WO2016/192301
PCT Pub. Date: Dec. 8, 2016

(65) Prior Publication Data
US 2017/0264865 A1 Sep. 14, 2017

(30) Foreign Application Priority Data
May 29, 2015 (CN) .......................... 2015 1 0289545

(51) Int. Cl.
*H04N 7/14* (2006.01)
*H01L 27/32* (2006.01)
(Continued)

(52) U.S. Cl.
CPC ......... *H04N 7/144* (2013.01); *H01L 27/3211* (2013.01); *H01L 27/3234* (2013.01);
(Continued)

(58) Field of Classification Search
USPC ....................................... 348/14.16
See application file for complete search history.

(56) References Cited

U.S. PATENT DOCUMENTS 5,903,395 A 5/1999 Rallison et al.
5,991,085 A 11/1999 Rallison et al.
(Continued)

FOREIGN PATENT DOCUMENTS

CN 101119435 A 2/2008
CN 102348091 A 2/2012
(Continued)

OTHER PUBLICATIONS

First Office Action for Chinese Application No. 201510289545.3, dated Jul. 12, 2017, 8 Pages.
(Continued)

*Primary Examiner* — Amal S Zenati
(74) *Attorney, Agent, or Firm* — Brooks Kushman P.C.

(57) ABSTRACT

A display device and a video communication terminal are provided. The display device includes a transparent display panel configured to display an image, a camera, configured to acquire an image of an object in front of the transparent display panel. According to the display device, the camera shooting component acquires the image of the local user at the front side of the transparent display panel through the transparent display panel. When the users are making a video call, the camera shooting component can acquire a front image of the local user's face through the transparent display panel.

17 Claims, 4 Drawing Sheets

(51) Int. Cl.
    *H01L 51/52*      (2006.01)
    *H04N 5/225*      (2006.01)
    *H04N 5/232*      (2006.01)
    *H04N 5/247*      (2006.01)
(52) U.S. Cl.
    CPC ...... *H01L 51/5218* (2013.01); *H01L 51/5234* (2013.01); *H04N 5/2256* (2013.01); *H04N 5/23219* (2013.01); *H04N 5/247* (2013.01); *H01L 2251/301* (2013.01); *H01L 2251/5315* (2013.01)

(56) References Cited

U.S. PATENT DOCUMENTS

| | | | |
|---|---|---|---|
| 6,160,666 A | | 12/2000 | Rallison et al. |
| 6,369,952 B1 | | 4/2002 | Rallison et al. |
| 2003/0058334 A1 | | 3/2003 | Boyden et al. |
| 2003/0112325 A1 | | 6/2003 | Boyden et al. |
| 2004/0257473 A1* | 12/2004 | Miyagawa | H04N 7/144 348/571 |
| 2009/0278913 A1* | 11/2009 | Rosenfeld | H04N 7/144 348/14.16 |
| 2012/0092440 A1* | 4/2012 | Cho | H04N 7/144 348/14.07 |
| 2013/0127976 A1* | 5/2013 | Nagano | H04N 7/144 348/14.01 |
| 2013/0182062 A1 | 7/2013 | Son et al. | |
| 2013/0201345 A1 | 8/2013 | Ling | |
| 2017/0019628 A1* | 1/2017 | Visosky | G06K 9/00281 |

FOREIGN PATENT DOCUMENTS

| | | |
|---|---|---|
| CN | 102547209 A | 7/2012 |
| CN | 102638669 A | 8/2012 |
| CN | 202587173 U | 12/2012 |
| CN | 104917993 A | 9/2015 |
| EP | 0977286 A2 | 2/2000 |
| EP | 1489844 A2 | 12/2004 |
| EP | 2469852 A1 | 6/2012 |
| EP | 2624545 A2 | 8/2013 |

OTHER PUBLICATIONS

International Search Report and Written Opinion for Application No. PCT/CN2015/093747, dated Mar. 4, 2016, 8 Pages.
Second Office Action for Chinese Application No. 201510289545.3, dated Jul. 30, 2018, 8 Pages.
European Search Report for Application No. 15891036.4, dated Nov. 27, 2018, 7 pages.

* cited by examiner

DISPLAY DEVICE AND VIDEO COMMUNICATION TERMINAL

CROSS-REFERENCE TO RELATED APPLICATIONS

This application is the U.S. national phase of PCT Application No. PCT/CN2015/093747 filed on Nov. 4, 2015, which claims priority to Chinese Patent Application No. 201510289545.3 filed on May 29, 2015, the disclosures of which are incorporated in their entirety by reference herein.

TECHNICAL FIELD

The present disclosure relates to the field of display technology, and in particular to a display device and a video communication terminal.

BACKGROUND

With a rapid development of the Internet and the mobile communication network, more and more people can experience the convenience and the enjoyment of the video communication. However, the camera of the video communication terminal in the related art is commonly arranged at the periphery of the displayer. As a result, a local user may not stare the camera when staring an image of a user at the other side of the call which is displayed on the displayer. In such case, in an image observed by the user at the other side, the local user is not staring the user at the other side, therefore an eye contact between them may not be achieved, and both the effect of the video call and a sense of immediacy are not good.

SUMMARY

An object of the present disclosure is to achieve an eye contact and communication between the two sides of the video call.

A display device is provided by the present disclosure, including:

a transparent display panel, configured to display an image; and a camera, configured to acquire an image of an object in front of the transparent display panel.

Optionally, the transparent display panel is a single-sided display panel which displays the image at a front side thereof.

Optionally, the transparent display panel includes a plurality of subpixel units arranged in an array form, and each of the subpixel units comprises a colorless transparent region and a light-emitting region which emits light at the front side of the transparent display panel.

Optionally, an area of the colorless transparent region is larger than an area of the light-emitting region.

Optionally, a first opaque electrode, a second transparent electrode and an organic light-emitting layer arranged between the first opaque electrode and the second transparent electrode are arranged at the light-emitting region, and the second transparent electrode is arranged at a side of the first electrode adjacent to the front side of the transparent display panel.

Optionally, the first electrode is made of a conductive material which is opaque and reflective.

Optionally, the conductive material includes at least one kind of silver and aluminum.

Optionally, the transparent display panel at least includes subpixel units in a first color, subpixel units in a second color and subpixel units in a third color which are periodically arranged on the transparent display panel.

Optionally, the camera is arranged at a back side of the transparent display panel and directly faces a center of the transparent display panel.

Optionally, the display device further includes a first position adjustment component configured to move the transparent display panel.

Optionally, the first position adjustment component includes a vertical movement mechanism configured to move the transparent display panel vertically and a horizontal movement mechanism configured to move the transparent display panel horizontally.

Optionally, the display device further includes reflection mechanism, wherein light passing through the transparent display panel is reflected by the reflection mechanism and then collected by the camera. The reflection mechanism is at the back side of the transparent display panel, and the camera is at a periphery of the transparent display panel.

Optionally, the display device further includes a second position adjustment component configured to move the camera.

Optionally, the second position adjustment component further includes:

a first position detection unit, configured to acquire a position of a face of the first object;

a second position detection unit, configured to acquire a position of a face of a person which is displayed on the transparent display panel; and a position control unit, configured to move the camera, to make both the face of the object and the face of the person which is displayed on the transparent display panel to be located in an optical path of the camera.

Optionally, the camera is a Charge Coupled Device (CCD) camera or a Complementary Metal-Oxide-Semiconductor Transistor (CMOS) camera.

A video communication terminal is further provided by the present disclosure, including the display device hereinabove.

According to the display device in the embodiment of the present disclosure, the camera acquires the image of the object in front of the transparent display panel. When the users are making a video call, the camera may acquire a front image of a local user's face, so as to achieve an eye contact and communication between the users at two sides of the video call, thereby improving effect of the video call and achieving a sense of immediacy.

DETAILED DESCRIPTION

The present disclosure will be described hereinafter in conjunction with the drawings and embodiments. The following embodiments are for illustrative purposes only, but shall not be used to limit the scope of the present disclosure.

A display device is provided in some embodiments of the present disclosure, including:

a transparent display panel, configured to display an image; and a camera, configured to acquire an image of an object in front of the transparent display panel.

According to the display device in the embodiment of the present disclosure, the camera acquires the image of the object in front of the transparent display panel. When the users are making a video call, the camera may acquire a front image of a local user's face, so as to achieve an eye contact and communication between the users at two sides of the video call, thereby improving effect of the video call and achieving a sense of immediacy.

Figure 1:
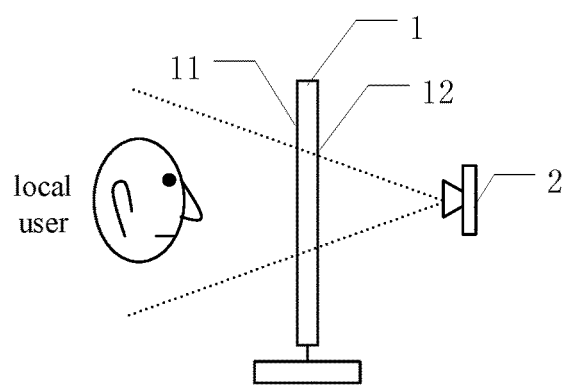
FIG. 1 is a schematic view of a display device in some embodiments of the present disclosure.
Figure 2:
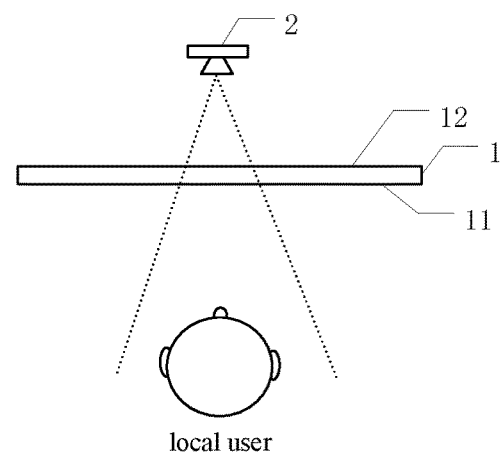
FIG. 2 is a top view of the display device shown in FIG. 1.

In order to acquire the front image of the local user's face by the camera, the camera may be arranged at a back side of the transparent display panel. As shown in FIGS. 1-2 which are schematic views of a display device in some embodiments of the present disclosure, the display device includes:

a transparent display panel 1, configured to display an image; and a camera shooting component 2, arranged at the back side 12 of the transparent display panel 1 and configured to acquire an image of an object at a front side 11 of the transparent display panel 1.

Figure 3:
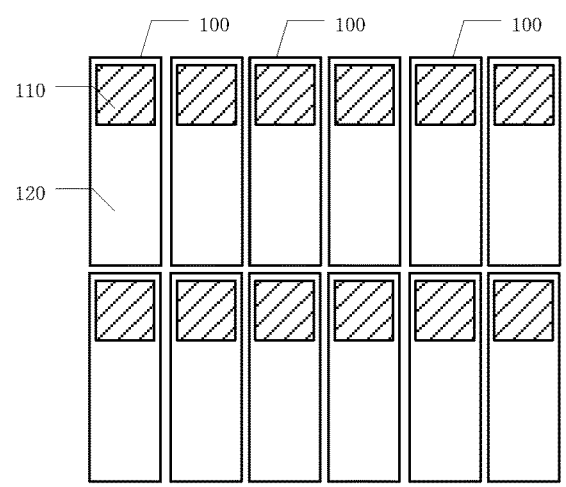
FIG. 3 is a schematic view of a transparent display panel in some embodiments of the present disclosure.

The transparent display panel hereinabove may be a self-luminous direct-view display panel. Optionally, the transparent display panel may be an organic electroluminescent see-through display panel. In addition, in order to improve a quality of an image of the local user's face acquired by the camera, the transparent display panel 1 may be a single-sided display panel which displays the image at the front side thereof, i.e., the local user may merely observe the displayed image at the front side 11 of the transparent display panel 1 and may not observe the displayed image at the back side 12 of the transparent display panel 1, thereby reducing the interference with the image acquisition of the camera caused by the image display of the transparent display panel. To be specific, as shown in FIG. 3 which is a schematic view of a transparent display panel in some embodiments of the present disclosure, the transparent display panel includes a plurality of subpixel units 100 arranged in an array form, and each of the subpixel units 100 includes a colorless transparent region 120 and a light-emitting region 110 which emits light merely at the front side of the transparent display panel. To be specific, each pixel sub-unit of the transparent display panel emits light of a corresponding color at the front side of the transparent display panel at the light-emitting region of the subpixel unit, so that the local user may observe the displayed image at the front side of the transparent display panel. Furthermore, the camera may acquire the image of the local user at the front side of the display panel through the transparent region of each subpixel unit, so that the camera may acquire a front image of the local user's face. Optionally, in each subpixel unit, an area of the colorless transparent region is larger than an area of the light-emitting region. In such case, the image displayed at the light-emitting regions is difficult to be detected at the back side of the display panel, thereby further improving the quality of the image acquired by the camera. At the front side of the display panel, a brightness of each light-emitting region is significantly larger than that of each transparent region when displaying an image, so that a brightness of the displayed image is significantly larger than that of the back side of the display panel. Due to characteristics of human eyes, the brightness of the back side of the display panel is suppressed by the displayed image, so that the local user cannot observe the back side of the display panel.

Figure 4:
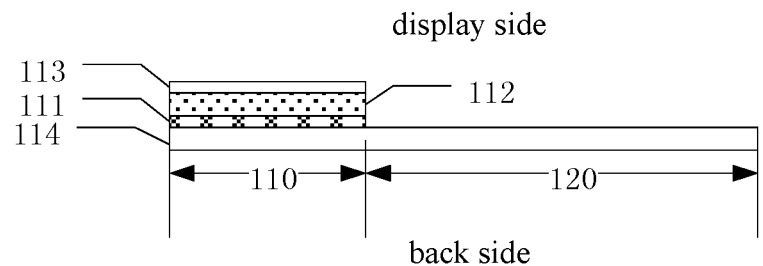
FIG. 4 is a schematic view of a pixel sub-unit of a transparent display panel in some embodiments of the present disclosure.

According to the transparent display panel hereinabove, the light-emitting region of each subpixel unit merely emits light at the front side of the display panel. The structure of each subpixel unit is shown in FIG. 4. The layers of each subpixel unit are arranged on a transparent base 114. To be specific, a first opaque electrode 111, a second transparent electrode 113 and an organic light-emitting layer 112 arranged between the first electrode 111 and the second electrode 113 are arranged at the light-emitting region 110, and the second electrode 113 is arranged at a side of the first electrode 111 adjacent to the front side of the transparent display panel. The first electrode may be a negative or a positive electrode. When the first electrode is a negative electrode, the second electrode is a positive electrode; while when the first electrode is a positive electrode, the second electrode is a negative electrode, and the present disclosure is not limited herein. The transparent second electrode 113 is arranged at a side of the organic light-emitting layer 112 adjacent to the front side of the transparent display panel, so that the light emitted by the organic light-emitting layer may pass through the second electrode and then an image may be displayed at the front side of the display panel. The first opaque electrode is arranged at a side of the organic light-emitting layer 112 adjacent to the back side of the transparent display panel, so that the light emitted by the organic light-emitting layer may not pass through the first electrode and then the displayed image may not be observed at the back side of the display panel, thereby reducing the interference with the image acquisition of the camera caused by the light-emitting region. Optionally, the first electrode 111 is made of a conductive material which is opaque and reflective, thereby increasing the brightness of the light-emitting region at the front side of the display panel. For example, the first electrode may be made of silver or aluminum.

Figure 5:
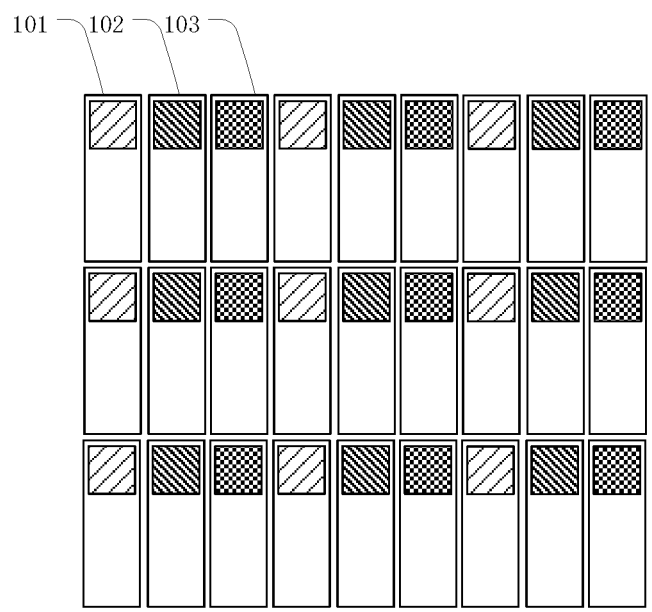
FIG. 5 is a schematic view of an arrangement of pixel sub-units of a transparent display panel in some embodiments of the present disclosure.

According to the display device in the embodiments of the present disclosure, in order to achieve a color display of the transparent display panel, the transparent display panel at least includes subpixel units in a first color, subpixel units in a second color and subpixel units in a third color which are periodically arranged on the transparent display panel. For example, the transparent display panel may be a RGB three-color display panel or a RGBW four-color display panel. For example, when the transparent display panel is a RGB three-color display panel, the transparent display panel includes, as shown in FIG. 5, red subpixel units 101, green subpixel units 102 and blue subpixel units 103 which are periodically arranged on the transparent display panel. The light-emitting region of each subpixel unit emits light, while the transparent region thereof does not emit light.

Optionally, the camera may be a Charge Coupled Device (CCD) camera or a Complementary Metal-Oxide-Semiconductor Transistor (CMOS) camera, which may be arranged in several ways. For example, the camera may be fixed at the back side of the transparent display panel and directly faces to a center of the transparent display panel. When making a video call, the local user may move the display panel manually or move the body to make eyes of a remote user in or closed to an optical path of the local camera, thereby achieving an eye contact between the users at two sides of the video call and improving a sense of immediacy.

Figure 6:
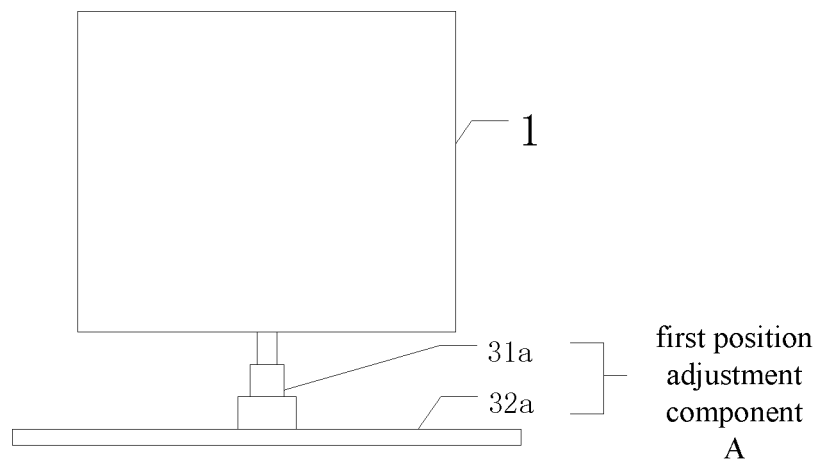
FIG. 6 is a schematic view of a display device in some embodiments of the present disclosure.

When the display device hereinabove is applied to the users at both sides of the video call, the local user may make the eyes of the remote user in at or closed to the optical path of the local camera by moving the transparent display panel, thereby achieving an eye contact between the users at two sides of the video call. Optionally, for the convenience of using, the display device further includes a first position adjustment component A configured to move the transparent display panel. As shown in FIG. 6, the first position adjustment component A may include a vertical movement mechanism 31a configured to move the transparent display panel 1 vertically and a horizontal movement mechanism 32a configured to move the transparent display panel 1 horizontally. For example, the vertical movement mechanism 31a may consist of a group of lifting rods which are embedded to each other, and the user may move the transparent display panel 1 vertically through the stretch and shrink of the lifting rods. The horizontal movement mechanism 32a may include a slide rail, and then the vertical movement mechanism 31a is mounted to the slide rail via a slide block, thereby achieving an horizontal movement of the transparent display panel.

Figure 7:
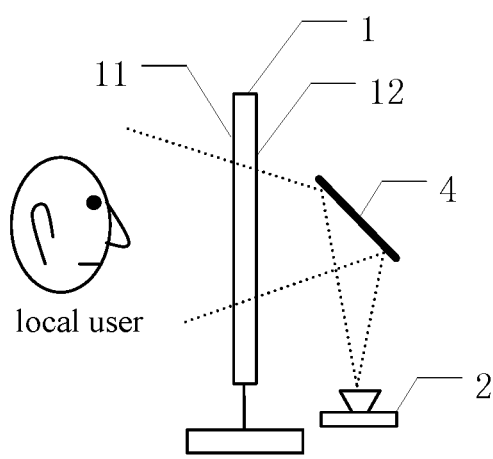
FIG. 7 is a schematic view of a display device in some embodiments of the present disclosure.

The camera may also be arranged at other positions at the back side of the transparent display panel, with a reflection mechanism being arranged at the back side of the transparent display panel, so that the camera may acquire the light passing through the transparent display panel and reflected by the reflection mechanism, and then acquire the front image of the local user's face. For example, an optical system such as retroreflector may be arranged at the back side the transparent display panel, and the optical path of the camera may be changed by the optical system, so as to arrange the camera more flexibly and achieve a more applicable system structure. For example, due to the retroreflector, the camera may be arranged at a periphery of the transparent display panel (e.g., upper side, lower side, left side or right side of the transparent display panel) to acquire the image of the local user, thereby thinning the display device. As shown in FIG. 7, the camera 2 may be arranged at the lower side of the transparent display panel, and a retroreflector 4 may be arranged at the back side of the transparent display panel, so that the camera 2 may acquire the image of the local user through the retroreflector 4, thereby thinning the transparent display panel. In addition, the optical path of the camera is through the transparent display panel, thereby also achieving an eye contact between the users at two sides of the video call.

In addition, the camera may further be mobilizable. The display device further includes a second position adjustment component B configured to move the camera. For example, a structure of the second position adjustment component B may be similar to the structure of the first position adjustment component A, and the user may move the camera manually.

Optionally, the second position adjustment component B may automatically move the camera based on the position of the face of the local user and a position of a face of a person displayed on the transparent display panel. The second position adjustment component B includes:

a first position detection unit 31b, configured to acquire a position of a face of the local user;

a second position detection unit 32b, configured to acquire a position of a face of a person which is displayed on the transparent display panel; and a position control unit 33b, configured to move the camera, so as to make both the face of the local user and the face of the person which is displayed on the transparent display panel in an optical path of the camera.

Figure 8:
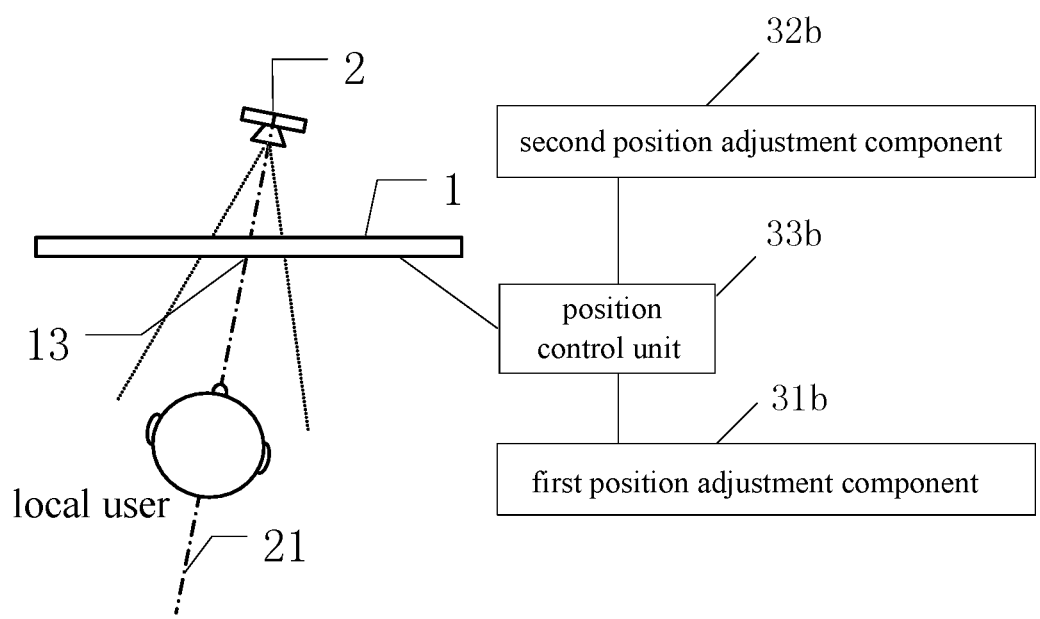
FIG. 8 is a schematic view of a display device in some embodiments of the present disclosure.

As shown in FIG. 8, when the position of the local user is changed, the first position detection unit 31b detects in real time the position of the local user's face and then sends the same to the position control unit 33b. The position control unit 33b moves the camera shooting component 2 based on the position of the local user's face and the position 13 of the face of the person displayed on the display panel 1, so as to make the face of the local user, the position 13 of the face of the person which is displayed on the transparent display panel and the camera 2 to be located at an identical straight line, so as to make both the face of the local user and the position 13 of the face of the person which is displayed on the transparent display panel in the optical path 21 of the camera 2, thereby achieving an eye contact there between. The first position detection unit and the second position detection unit may be implemented by image analysis software.

In addition, a video communication terminal is further provided by the present disclosure, including the display device hereinabove.

The above embodiments are for illustrative purposes only, but shall not be used to limit the scope of the present disclosure. A person skilled in the art may make further modifications and improvements without departing from the principle of the present disclosure, and these modifications and improvements shall also fall within the scope of the present disclosure.

What is claimed is:

1. A display device, comprising:
    a transparent display panel, configured to display an image; and
    a camera, configured to acquire an image of an object in front of the transparent display panel;
    wherein the transparent display panel comprises a plurality of subpixel units arranged in an array form, and each of the subpixel units comprises a colorless transparent region and a light-emitting region which emits light at the front side of the transparent display panel;
    an area of the colorless transparent region is larger than an area of the light-emitting region; and
    a second position adjustment component configured to move the camera automatically, wherein the second position adjustment component comprises:
    a first position detection unit, configured to acquire a position of a face of the object;
    a second position detection unit, configured to acquire a position of a face of a person which is displayed on the transparent display panel; and
    a position control unit, configured to move the camera, to make the face of the object, the face of the person which is displayed on the transparent display panel and the camera to be at an identical straight line.

2. The display device according to claim 1, wherein the transparent display panel is a single-sided display panel which displays the image at a front side thereof.

3. The display device according to claim 2, wherein a first opaque electrode, a second transparent electrode and an organic light-emitting layer arranged between the first opaque electrode and the second transparent electrode are arranged at the light-emitting region, and the second transparent electrode is arranged at a side of the first electrode adjacent to the front side of the transparent display panel.

4. The display device according to claim 3, wherein the first electrode is made of a conductive material which is opaque and reflective.

5. The display device according to claim 4, wherein the conductive material comprises at least one kind of silver and aluminum.

6. The display device according to claim 2, wherein the transparent display panel at least comprises subpixel units in a first color, subpixel units in a second color and subpixel units in a third color which are periodically arranged on the transparent display panel.

7. The display device according to claim 1, wherein the camera is arranged at a back side of the transparent display panel and directly faces a center of the transparent display panel.

8. The display device according to claim 1, further comprising a reflection mechanism, wherein light passing through the transparent display panel is reflected by the reflection mechanism and then collected by the camera;
the reflection mechanism is at the back side of the transparent display panel, and the camera is at a periphery of the transparent display panel.

9. The display device according to claim 1, wherein the camera is a Charge Coupled Device (CCD) camera or a Complementary Metal-Oxide-Semiconductor Transistor (CMOS) camera.

10. A video communication terminal, comprising the display device according to claim 1.

11. The display device according to claim 2, wherein the camera is arranged at a back side of the transparent display panel and directly faces a center of the transparent display panel.

12. The display device according to claim 2, further comprising a first position adjustment component configured to move the transparent display panel.

13. The display device according to claim 2, further comprising a reflection mechanism, wherein light passing through the transparent display panel is reflected by the reflection mechanism and then collected by the camera;
the reflection mechanism is at the back side of the transparent display panel, and the camera is at a periphery of the transparent display panel.

14. The display device according to claim 2, further comprising a second position adjustment component configured to move the camera.

15. A display device, comprising:
a transparent display panel, configured to display an image;
a camera, configured to acquire an image of an object in front of the transparent display panel; and
a first position adjustment component configured to move the transparent display panel;
wherein the transparent display panel comprises a plurality of subpixel units arranged in an array form, and each of the subpixel units comprises a colorless transparent region and a light-emitting region which emits light at the front side of the transparent display panel;
an area of the colorless transparent region is larger than an area of the light-emitting region, and
a second position adjustment component configured to move the camera automatically, wherein the second position adjustment component comprises:
a first position detection unit, configured to acquire a position of a face of the object;
a second position detection unit, configured to acquire a position of a face of a person which is displayed on the transparent display panel; and
a position control unit, configured to move the camera, to make the face of the object, the face of the person which is displayed on the transparent display panel and the camera to be at an identical straight line.

16. The display device according to claim 15, wherein the first position adjustment component comprises a vertical movement mechanism configured to move the transparent display panel vertically and a horizontal movement mechanism configured to move the transparent display panel horizontally.

17. The display device according to claim 16, wherein the vertical movement mechanism of the first position adjustment component comprises a group of lifting rods which are embedded to each other, and the horizontal movement mechanism of the first position adjustment component comprises a slide rail and a slide block.

* * * * *